United States Patent
Chiu et al.

(10) Patent No.: US 10,784,296 B2
(45) Date of Patent: Sep. 22, 2020

(54) IMAGE SENSOR AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: Tzu Yin Chiu, Shanghai (CN); Chong Wang, Shanghai (CN); Haifang Zhang, Shanghai (CN); Xuanjie Liu, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/392,087

(22) Filed: Apr. 23, 2019

(65) Prior Publication Data

US 2019/0252422 A1  Aug. 15, 2019

Related U.S. Application Data

(62) Division of application No. 15/820,547, filed on Nov. 22, 2017, now abandoned.

(30) Foreign Application Priority Data

Dec. 20, 2016  (CN) .......................... 2016 1 1180246

(51) Int. Cl.
  *H01L 27/14*  (2006.01)
  *H01L 27/146*  (2006.01)

(52) U.S. Cl.
  CPC .... *H01L 27/1461* (2013.01); *H01L 27/14609* (2013.01); *H01L 27/14636* (2013.01);
  (Continued)

(58) Field of Classification Search
  CPC .......... H01L 27/1461; H01L 27/14609; H01L 27/14636; H01L 27/14643; H01L 27/14689; H01L 27/14698
  (Continued)

(56) References Cited

U.S. PATENT DOCUMENTS 6,326,652 B1   12/2001  Rhodes
2004/0251482 A1  12/2004  Rhodes
(Continued)

*Primary Examiner* — Didarul A Mazumder
(74) *Attorney, Agent, or Firm* — Brinks Gilson & Lione

(57) ABSTRACT

The present disclosure relates to the technical field of semiconductors, and discloses an image sensor and a manufacturing method therefor. The image sensor includes: a semiconductor substrate; a first active region located on the semiconductor substrate; a doped semiconductor layer located on the first active region; and a contact located on the semiconductor layer, where the first active region includes: a first doped region and a second doped region abutting against the first doped region, wherein the second doped region is located at an upper surface of the first active region, and wherein the second doped region is formed by dopants in the semiconductor layer that are annealed to be diffused to a surface layer of the first doped region. The present disclosure may reduce leakage current and improve device performances.

14 Claims, 8 Drawing Sheets

(52) U.S. Cl.
CPC .. *H01L 27/14643* (2013.01); *H01L 27/14689* (2013.01); *H01L 27/14698* (2013.01)

(58) Field of Classification Search
USPC .................................................. 257/292, 48
See application file for complete search history.

(56) References Cited

U.S. PATENT DOCUMENTS

| | | |
|---|---|---|
| 2006/0043436 A1 | 3/2006 | Fan |
| 2009/0303366 A1 | 12/2009 | Gambino |
| 2011/0024807 A1* | 2/2011 | Katayama ......... H01L 27/14603 257/292 |
| 2012/0252155 A1 | 10/2012 | Choi |
| 2014/0175529 A1 | 6/2014 | Park |
| 2015/0076500 A1* | 3/2015 | Sakaida ............ H01L 27/14612 257/59 |
| 2018/0012992 A1* | 1/2018 | Lee .................... H01L 29/1083 |

* cited by examiner

IMAGE SENSOR AND MANUFACTURING METHOD THEREFOR

RELATED APPLICATION

The present application is a divisional of U.S. application Ser. No. 15/820,547 (still pending), filed Nov. 22, 2017 which claims priority to Chinese Patent Appln. No. 201611180246.7, filed Dec. 20, 2016, the entire contents of each of which is hereby incorporated by reference.

BACKGROUND

Technical Field

The present disclosure relates to the technical field of semiconductors, and in particular, to an image sensor and a manufacturing method therefor.

Related Art

FIG. 1A is a circuit connection diagram that schematically illustrates a CIS (Contact Image Sensor) in the prior art. As shown in FIG. 1A, the CIS includes a photodiode 101 and four transistors. The four transistors are a first transistor 102, a second transistor 103, a third transistor 104, and a fourth transistor 105. A floating diffusion (FD) region is provided between the first transistor 102 and the second transistor 103. Photons of the photodiode 101 are stored at the FD region after being converted into electric charges, where the FD region herein serves as a capacitor for storing electric charges.

FIG. 1B is a top view that schematically illustrates a part of a circuit structure of a CIS. FIG. 1B shows an active region 111, the photodiode 101, the first transistor 102, the FD region, the second transistor 103, and a metal contact 110. FIG. 1C is a schematic sectional diagram that schematically illustrates a structure in FIG. 1B that is intercepted along a line A-A'. FIG. 1C shows the first transistor 102, the second transistor 103, and the metal contact 110. In addition, FIG. 1C further shows a P-type well region 122, an N-type doped region 121, and a depletion region 123, where these regions form a part of the FD region. At present, a situation of leakage current would easily occur to the FD region.

SUMMARY

The foregoing prior art has problems, and present disclosure provides a new technical solution regarding at least one of the foregoing problems.

In a first aspect of the present disclosure, an image sensor is provided, including: a semiconductor substrate; a first active region located on the semiconductor substrate; a doped semiconductor layer located on the first active region; and a contact located on the semiconductor layer, where the first active region includes: a first doped region and a second doped region abutting against the first doped region, the second doped region is located at an upper surface of the first active region, and the second doped region is formed by dopants in the semiconductor layer that are annealed to be diffused to a surface layer of the first doped region.

In some implementations, a conductivity type of the first doped region is contrary to a conductivity type of the second doped region.

In some implementations, the semiconductor layer includes polysilicon.

In some implementations, the first active region further includes: a third doped region abutting against the first doped region, where a conductivity type of the third doped region is contrary to a conductivity type of the first doped region.

In some implementations, the image sensor further includes: a first gate structure located on the first active region and above a portion at which the first doped region abuts against the third doped region.

In some implementations, the image sensor further includes: a spacer located on the first active region and at a side surface of the first gate structure, the spacer separating the semiconductor layer and the first gate structure.

In some implementations, the first active region further includes: a fourth doped region abutting against the third doped region and separated from the first doped region, where a part of the fourth doped region is located below the first gate structure and where a conductivity type of the fourth doped region is contrary to the conductivity type of the third doped region.

In some implementations, the image sensor further includes: a barrier layer covering a part of the first gate structure, the semiconductor layer, and first active region, where the contact passes through the barrier layer so as to be in contact with the semiconductor layer.

In some implementations, the image sensor further includes: a second active region located on the semiconductor substrate and separated from the first active region, and a third active region located on the semiconductor substrate and separated from the second active region, where the second active region includes a fifth doped region, the third active region includes a sixth doped region, and a conductivity type of the sixth doped region is contrary to a conductivity type of the fifth doped region.

In some implementations, the image sensor further includes: a second gate structure located on the second active region, and a third gate structure located on the third active region; a first source electrode and a first drain electrode in the second active region and located at two sides of the second gate structure, the first source electrode and the first drain electrode abutting against the fifth doped region, separately; and a second source electrode and a second drain electrode in the third active region and located at two sides of the third gate structure, the second source electrode and the second drain electrode abutting against the sixth doped region, separately.

In implementations of the image sensor of the present disclosure, a contact is formed on the semiconductor layer and is not in direct contact with active regions. In this way, the active regions would not be directly damaged, damages to the active regions caused by etching the contact are reduced in the traditional process, and defects caused when forming the contact are kept away from a junction field formed by a second doped region and a first doped region. Therefore, leakage current may be reduced, and device performances may be improved.

Further, the junction field formed by a second doped region and a first doped region is a shallow junction. Depth and width of the shallow junction are small, and area and perimeter of the shallow junction are also small. Therefore, the leakage current may also be reduced, and device performances may be improved.

In another aspect of the present disclosure, a method for manufacturing an image sensor is provided. The method may include: providing a semiconductor structure, where the semiconductor structure includes: a semiconductor substrate and a first active region located on the semiconductor substrate, the first active region including a first doped region; forming a doped semiconductor layer on the first active region; annealing to diffuse dopants in the semiconductor layer to a surface layer of the first doped region, so as to form a second doped region, where the second doped region is located at an upper surface of the first active region; and forming a contact connected to the semiconductor layer.

In some implementations, forming a doped semiconductor layer includes: forming an undoped semiconductor layer on the first doped region; and executing a first doping to the undoped semiconductor layer so as to form the doped semiconductor layer, the first doping enabling a conductivity type of the semiconductor layer to be contrary to the conductivity type of the first doped region.

In some implementations, a conductivity type of the first doped region is contrary to a conductivity type of the second doped region.

In some implementations, material of the semiconductor layer includes polysilicon.

In some implementations, the first doping is executed using an ion implantation, and energy of the ion implantation is determined according to thickness of the semiconductor layer, so that a depth of the ion implantation does not exceeds the semiconductor layer.

In some implementations, the method further includes: before the doped semiconductor layer is formed, forming a first gate structure located on the first active region.

In some implementations, before the doped semiconductor layer is formed, the method further includes: forming a spacer layer on the semiconductor structure and the first gate structure; and partially etching the spacer layer to expose a part of the first doped region. The step of forming the doped semiconductor layer includes: forming the doped semiconductor layer on the exposed part of the first doped region.

In some implementations, in the step of the partially etching the spacer layer, the spacer layer covering a side surface of the first gate structure is etched to form a first part of the spacer; in the step of the forming the semiconductor layer, the first part of the spacer separates the semiconductor layer and the first gate structure; and the method further includes, after the undoped semiconductor layer is formed, and before the first doping is executed to the undoped semiconductor layer, etching a remainder of the spacer layer so as to form a second part of the spacer covering the side surface of the first gate structure.

In some implementations, the first active region further includes: a third doped region abutting against the first doped region, where a conductivity type of the third doped region is contrary to a conductivity type of the first doped region, and the first gate structure is above a portion at which the first doped region abuts against the third doped region.

In some implementations, the first active region further includes: a fourth doped region abutting against the third doped region and separated from the first doped region, a part of the fourth doped region being located below the first gate structure, where a conductivity type of the fourth doped region is contrary to the conductivity type of the third doped region.

In some implementations, a temperature range of the annealing is from 700° C. to 1000° C., and a time range of the annealing is from 5 min to 1 h.

In some implementations, the method further includes, after the annealing is executed and before the contact is formed, forming a barrier layer on a part of the first gate structure, the semiconductor layer, and the first active region; and where forming the contact includes: etching the barrier layer to form an opening exposing a part of the semiconductor layer; and forming, in the opening, the contact connected to the semiconductor layer.

In some implementations, the image sensor further includes: forming a second active region located on the semiconductor substrate and separated from the first active region, and a third active region located on the semiconductor substrate and separated from the second active region, where the second active region includes a fifth doped region, the third active region includes a sixth doped region, and a conductivity type of the sixth doped region is contrary to a conductivity type of the fifth doped region.

In some implementations, the method further includes: forming a second gate structure located on the second active region, and a third gate structure located on the third active region; after the annealing and before the contact is formed, executing a second doping to the second active region, so as to form, in the fifth doped region, a first source electrode and a first drain electrode at two sides of the second gate structure, separately; and executing a third doping to the third active region, so as to form, in the sixth doped region, a second source electrode and a second drain electrode at two sides of the third gate structure, separately.

Forms of the foregoing manufacturing method enable a contact to be formed on the semiconductor layer and not in direct contact with active regions. In this way, the active regions would not be directly damaged, damages to the active regions caused by etching the contact are reduced in comparison with the traditional process, and defects caused when forming the contact are kept away from a junction field formed by a second doped region and a first doped region. Therefore, leakage current may be reduced, and device performances may be improved.

Further, in the foregoing process of annealing to propel dopants in the semiconductor layer into the first doped region, a depth and a width of the propulsion are small, and a shallow junction is formed. Area and perimeter of the junction are also small. Therefore, the leakage current may also be reduced, and device performances may be improved.

As embodiment and forms of the present disclosure are presented for illustration purposes with reference to the accompanying drawings, other characters and advantages of the present invention become clear.

BRIEF DESCRIPTION OF THE DRAWINGS

The accompanying drawings, which form a part of the description and describe embodiments and forms of the present disclosure, are used to explain the principles of the present disclosure together with the specification.

With reference to the accompanying drawings, the present disclosure may be understood more clearly according to the following detailed description, where.

DETAILED DESCRIPTION

Embodiments and forms of the present disclosure are described in detail for illustration purposes with reference to the accompanying drawings. It should be noted that unless being described in detail, relative layouts, mathematical expressions, and numeric values of components and steps described in these embodiments and forms do not limit the scope of the present invention.

Meanwhile, it should be understood that for ease of description, sizes of the parts shown in the accompanying drawings are not drawn according to an actual proportional relationship.

The following description about at least one embodiment is presented for illustration purposes only, and should not be used as any limitation on the present disclosure and applications or uses of the present disclosure.

Technologies, methods, and devices that are known by a person of ordinary skill in the related fields may not be discussed in detail. However, in proper cases, the technologies, methods, and devices should be considered as a part of the authorized description.

In all examples shown and discussed herein, any specific value should be explained as for illustration purposes only rather than as a limitation. Therefore, other examples of the embodiments for illustration purposes may have different values.

It should be noted that similar reference signs and letters represent similar items in the following accompanying drawings. Therefore, once an item is defined in a figure, the item needs not to be further discussed in the subsequent figures.

Figure 1A:
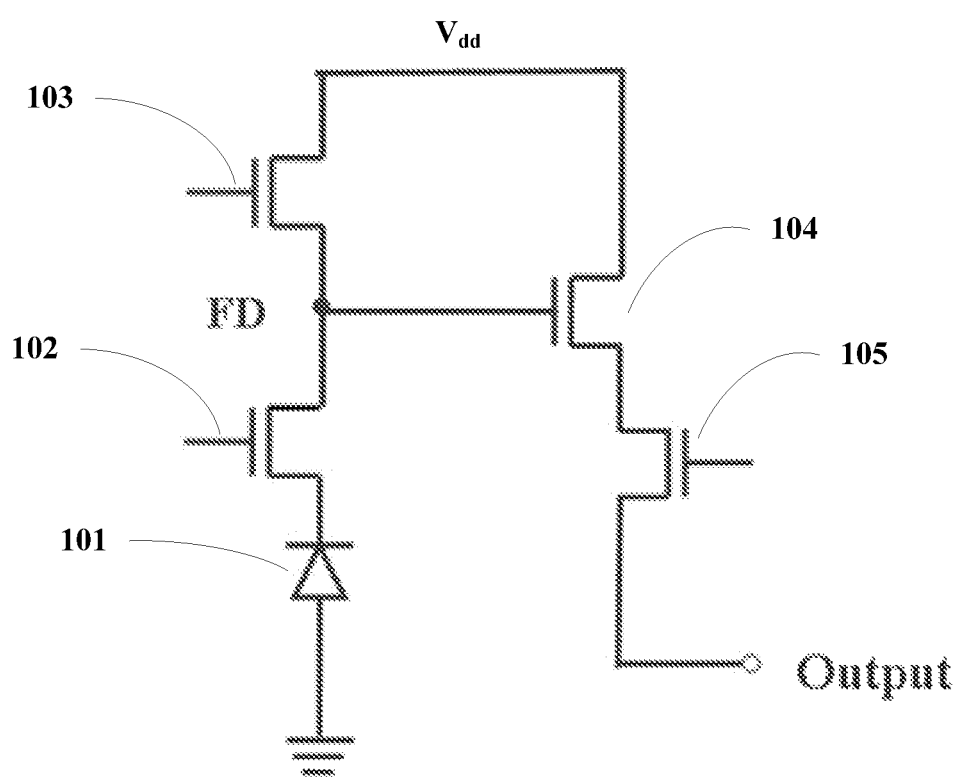
FIG. 1A is a circuit connection diagram that schematically illustrates a CIS in the art.
Figure 1B:
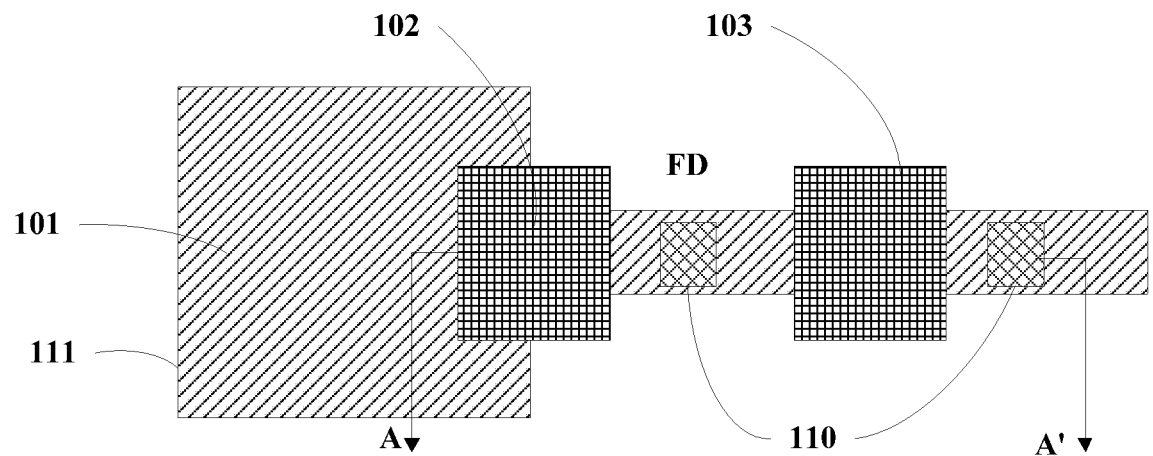
FIG. 1B is a top view that schematically illustrates a part of a circuit structure of a CIS.
Figure 1C:
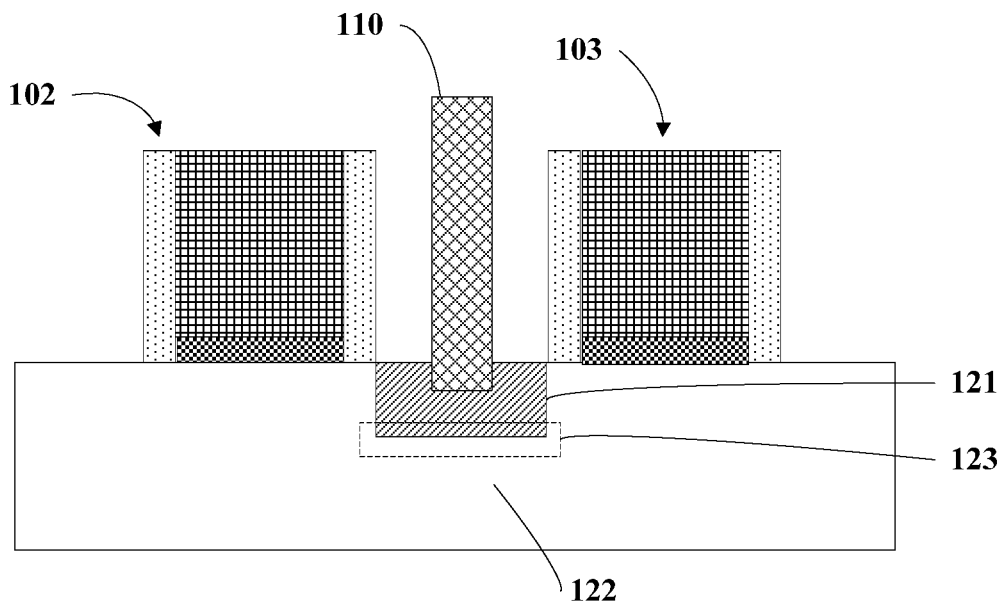
FIG. 1C is a schematic sectional diagram that schematically illustrates a structure in FIG. 1B that is intercepted along a line A-A'.

As shown in FIG. 1C, in a case, an N/P junction field formed by an N-type doped region 121 and a P-type well region 122 may affect leakage current. For example, greater area and perimeter of the N/P junction may bring in more leakage current. In another case, when forming a metal contact 110 through the etching process, the etching may cause lattice defects to silicon below the metal contact 110, thereby also generating the leakage current. However, leakage current of the FD region may bring in pixel noise, for example, including FPN (fix pattern noise) and flashing pixels in a final image.

Figure 2:
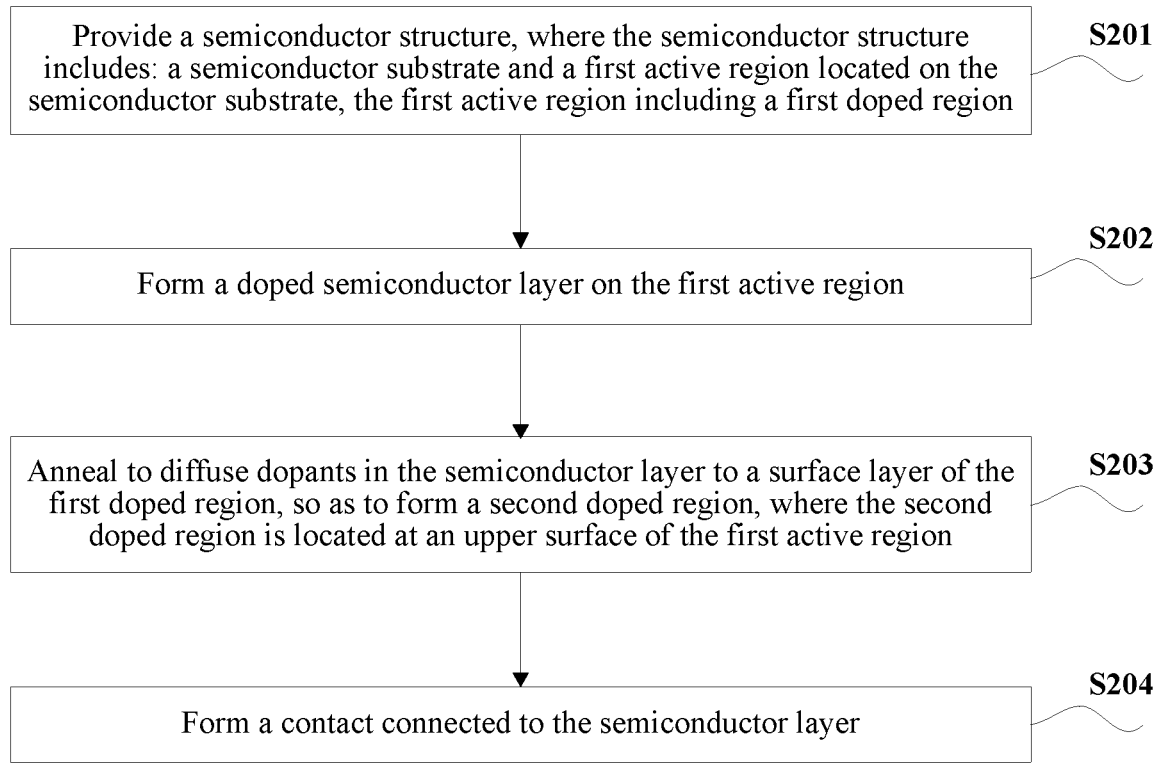
FIG. 2 is a flowchart of a method for manufacturing an image sensor.

FIG. 2 is a flowchart of one form of a method for manufacturing an image sensor.

In step S201, a semiconductor structure is provided. The semiconductor structure includes: a semiconductor substrate and a first active region located on the semiconductor substrate, where the first active region includes a first doped region.

In step S202, a doped semiconductor layer is formed on the first active region. For example, step S202 may include: forming an undoped semiconductor layer on the first doped region, and executing a first doping to the undoped semiconductor layer to form the doped semiconductor layer. The first doping enables a conductivity type of the semiconductor layer to be contrary to the conductivity type of the first doped region. For example, material of the semiconductor layer may include polysilicon.

In step S203, annealing is performed to diffuse dopants in the semiconductor layer to a surface layer of the first doped region, so as to form a second doped region, where the second doped region is located at an upper surface of the first active region. For example, an upper surface of the second doped region is a part of the upper surface of the first active region. For example, the conductivity type of the first doped region is contrary to a conductivity type of the second doped region.

In step S204, a contact connected to the semiconductor layer is formed.

The foregoing manufacturing method enables a contact to be formed on the semiconductor layer and not in direct contact with active regions. In this way, the active regions would not be directly damaged, damages to the active regions caused by etching the contact are reduced when compared to the traditional process, and defects caused when forming the contact are kept away from a junction field formed by a second doped region and a first doped region. Therefore, leakage current may be reduced, and device performances may be improved.

Further, in the foregoing process of annealing to propel dopants in the semiconductor layer into the first doped region, a depth and a width of the propulsion are small, and a shallow junction is formed. An area and perimeter of the junction are also small. Therefore, the leakage current may also be reduced, and device performances may be improved.

FIG. 3 to FIG. 13 are schematic sectional diagrams that schematically illustrate a structure at a plurality of phases of a manufacturing process of an image sensor. A manufacturing process of an image sensor is described below in detail with reference to FIG. 3 to FIG. 13.

Figure 3:
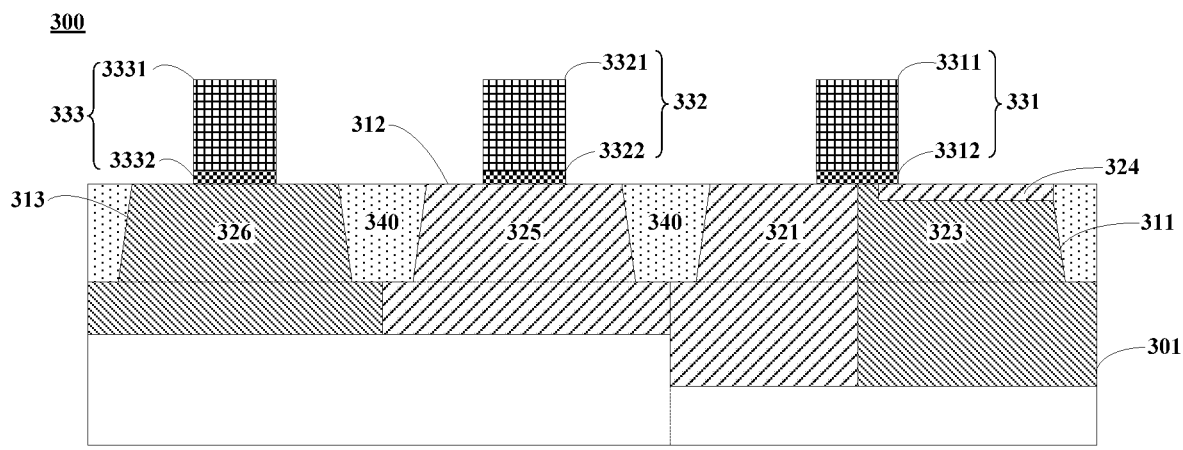
FIG. 3 to FIG. 13 are schematic sectional diagrams that schematically illustrate a structure at a plurality of phases of a manufacturing process of an image sensor.

First, as shown in FIG. 3, a semiconductor structure 300 is provided.

As shown in FIG. 3, the semiconductor structure 300 may include a semiconductor substrate 301. For example, the semiconductor substrate 301 may be a silicon substrate or a substrate made of other materials. It should be noted that the dotted lines shown in FIG. 3 only are boundary lines that schematically describe different structures. Actually, these dotted lines do not necessarily exist, and other accompany drawing are similar.

As shown in FIG. 3, the semiconductor structure 300 may further include a first active region 311 located on the semiconductor substrate 301. The first active region 311 may include: a first doped region 321 (for example, the first doped region 321 may be a part of the FD region).

In some implementations, the first active region 311 may further include: a third doped region 323 abutting against the first doped region 321. It should be noted that the term "abutting against" herein indicates that the first doped region 321 and the third doped region 323 are in left-and-right contact along a horizontal direction.

In some implementations, a conductivity type of the third doped region 323 is contrary to a conductivity type of the first doped region 321. For example, the conductivity type of the first doped region 321 is P-typed, and the conductivity type of the third doped region 323 is N-typed; or the conductivity type of the first doped region 321 is N-typed, and the conductivity type of the third doped region 323 is P-typed. In some implementations, as shown in FIG. 3, the first doped region 321 and the third doped region 323 may extend into the semiconductor substrate 301, separately. As shown in FIG. 3, an upper surface of the first doped region 321 may be a part of an upper surface of the first active region 311.

In some implementations, the manufacturing method may further include: before the doped semiconductor layer (would be described in the following) is formed, forming a first gate structure 331 located on the first active region 311. The first gate structure 331 is above a portion at which the first doped region 321 abuts against the third doped region 323. For example, the first gate structure 331 may include: a first gate insulator layer 3312 located on the first active region 311 and a first gate electrode 3311 on the first gate insulator layer 3312. Material of the first gate insulator layer 3312 may include, for example, silicon dioxide. Material of the first gate electrode 3311 may include, for example, poly silicon. Optionally, the first gate structure 331 may further include a first hard mask layer (not shown in the figure, such as silicon nitride) located on the first gate electrode 3311.

In some implementations, as shown in FIG. 3, the first active region 311 may further include: a fourth doped region 324 abutting against the third doped region 323 and separated from the first doped region 321. The third doped region 323 abutting against the fourth doped region 324 indicates that the fourth doped region 324 and the third doped region 323 are in up-and-down contact along a vertical direction and are also in left-and-right contact along a horizontal direction. A part of the fourth doped region 324 is located below the first gate structure 331. An upper surface of the first doped region 324 may be a part of the upper surface of the first active region 311. A conductivity type of the fourth doped region 324 is contrary to the conductivity type of the third doped region 323. For example, the conductivity type of the third doped region 323 may be N-typed, and the conductivity type of the fourth doped region 324 may be P-typed. A PN junction of a photodiode is formed by the fourth doped region 324 and the third doped region 323.

In some implementations, as shown in FIG. 3, the manufacturing method may further include: forming a second active region 312 located on the semiconductor substrate 301 and separated from the first active region 311, and a third active region 313 located on the semiconductor substrate 301 and separated from the second active region 312. For example, a trench isolation portion 340 may be used to separate the second active region 312 and the first active region 311, and separate the third active region 313 and the second active region 312. The trench isolation portion 340 may include a trench formed around the active regions and an insulator layer (for example, silicon dioxide) filling the trench.

As shown in FIG. 3, the second active region 312 may include a fifth doped region 325, and the third active region 313 may include a sixth doped region 326. Preferably, the fifth doped region 325 and the sixth doped region 326 extend into the semiconductor substrate 301, separately. For example, a conductivity type of the sixth doped region 326 is contrary to a conductivity type of the fifth doped region 325. Further for example, the conductivity type of the fifth doped region 325 is same to the conductivity type of the first doped region 321.

In some implementations, as shown in FIG. 3, the manufacturing method may further include: forming a second gate structure 332 located on the second active region 312, and a third gate structure 333 located on the third active region 313.

For example, the second gate structure 332 may include: a second gate insulator layer 3322 located on the second active region 312 and a second gate electrode 3321 on the second gate insulator layer 3322. Material of the second gate insulator layer 3322 may include, for example, silicon dioxide. Material of the second gate electrode 3321 may include, for example, polysilicon. Optionally, the second gate structure 332 may further include a second hard mask layer (not shown in the figure, such as silicon nitride) located on the second gate electrode 3321.

For example, the third gate structure 333 may include: a third gate insulator layer 3332 located on the third active region 313 and a third gate electrode 3331 on the third gate insulator layer 3332. Material of the third gate insulator layer 3332 may include, for example, silicon dioxide. Material of the third gate electrode 3331 may include, for example, polysilicon. Optionally, the third gate structure 333 may further include a third hard mask layer (not shown in the figure, such as silicon nitride) located on the third gate electrode 3331.

The second active region 312, the second gate structure on the second active region 312, the third active region 313, and the third gate structure 333 on the third active region 313 may be used to form transistors of a logic circuit.

It should be noted that some details generally known in the art are not shown in FIG. 3. However, according to the foregoing description, a person skilled in the art may completely understand how to implement the technical solutions disclosed herein.

In addition, it should be noted that the active regions (for example, the first active region, the second active region, and the third active region) referred in the present disclosure may be active regions of a planar-type device, and may also be active regions of a fin-type device. Therefore, the scope of the present disclosure is not limited hereto.

Figure 4:
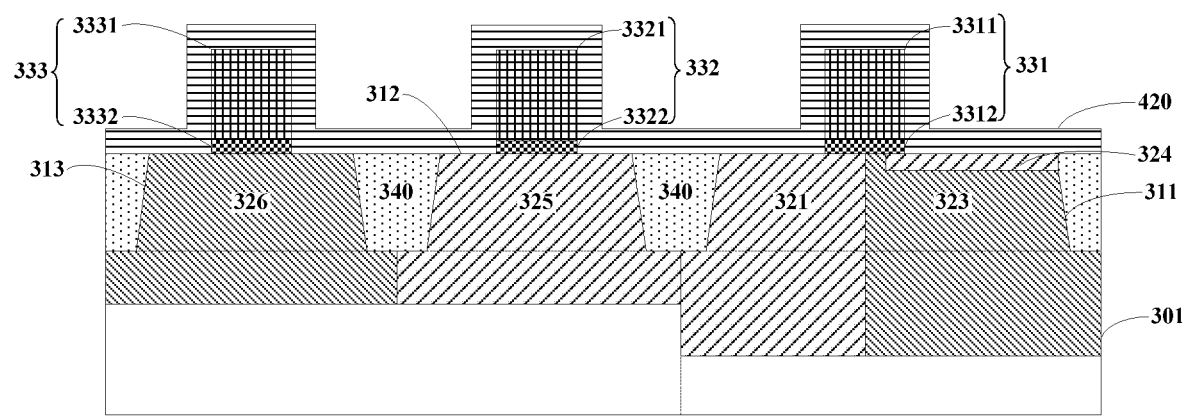

Subsequently, as shown in FIG. 4, for example, a spacer layer 420 is formed on the semiconductor structure 300 and the first gate structure 331 using the deposition process. For example, material of the spacer layer 420 may include: an oxide of silicon and/or a nitride of silicon.

Figure 5:
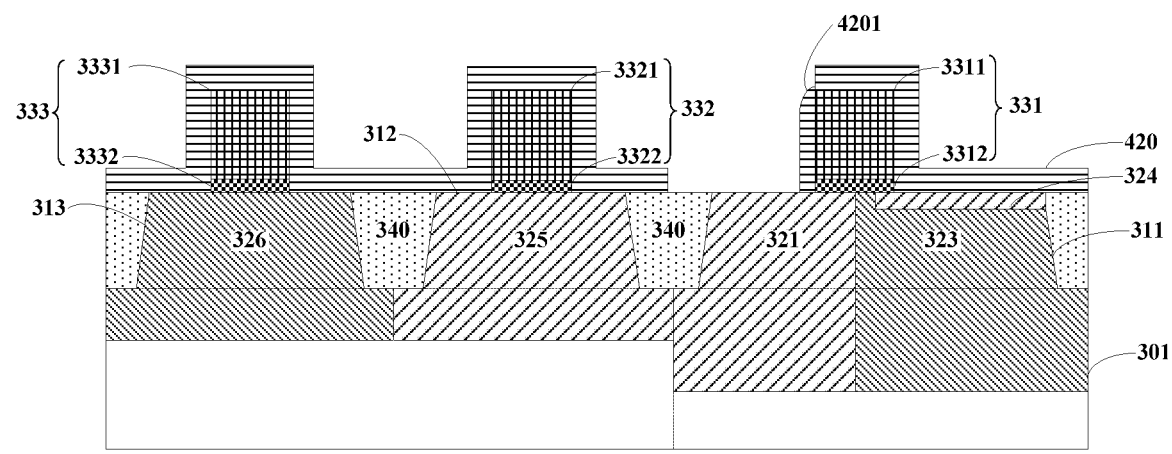

Subsequently, as shown in FIG. 5, the spacer layer 420 is partially etched to expose a part of the first doped region 321. Preferably, as shown in FIG. 5, the spacer layer covering a side surface of the first gate structure 331 is etched to form a first part of the spacer 4201. Optionally, the step of the partially etching the spacer layer may include: forming a patterned first mask layer (not shown in the figure, such as photoresist) on the spacer layer 420, where the first mask layer exposes a part of the spacer layer which needs to be etched. For example, a part of the spacer layer which is located above the first doped region 321 is exposed. Optionally, the step of partially etching the spacer layer may further include: using the first mask layer as a (for example, through the wet etching process) to etch the exposed part of the spacer layer, so as to remove the part of the spacer layer which is located above the first doped region 321. In the etched part, a part of the spacer layer which is located at the side surface of the first gate structure is formed as the first part of the spacer 4201. Optionally, the step of the partially etching the spacer layer may further include: removing the first mask layer. In some implementations, in the foregoing step of partially etching the spacer layer, a part of the trench isolation portion 340 may be exposed, as shown in FIG. 5.

Subsequently, a doped semiconductor layer is formed on the exposed part of the first doped region.

Figure 6:
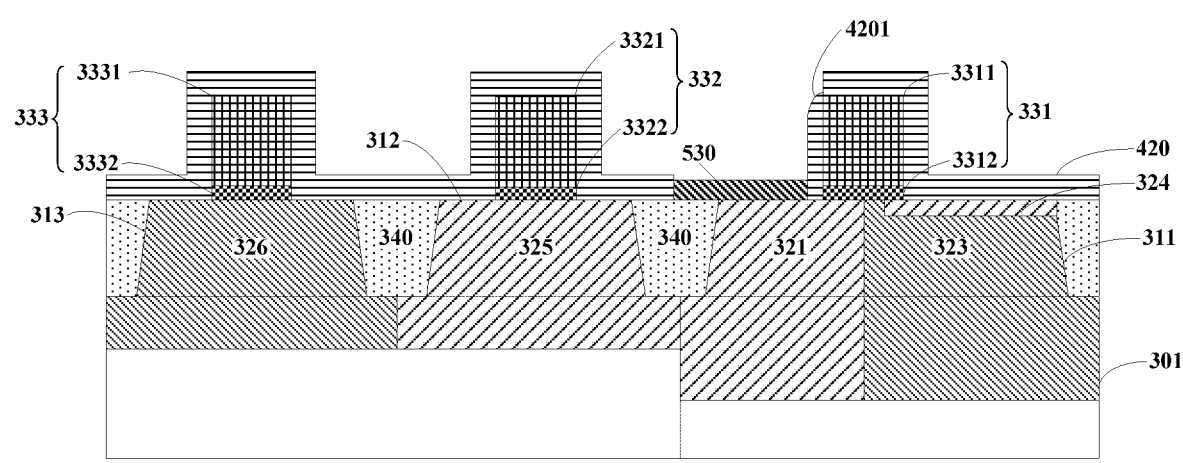

For example, as shown in FIG. 6, an undoped semiconductor layer 530 is formed on the exposed part of the first doped region 321. Material of the semiconductor layer may include, for example, polysilicon. In this step, the first part of the spacer 4201 separates the semiconductor layer 530 and the first gate structure 331. Optionally, the step of the forming an undoped semiconductor layer may include: forming a semiconductor layer covering a semiconductor structure on the semiconductor structure shown in FIG. 5. Optionally, the step of the forming an undoped semiconductor layer may further include: forming a patterned second mask layer (not shown in the figure, such as photoresist) on the semiconductor layer, where the second mask layer covers a part of the semiconductor layer which is above the first doped region 321; and then removing, for example, using the dry etching process, a part of the semiconductor layer which is not covered. The dry etching is stopped on the spacer layer 420. Optionally, the step of the forming an undoped semiconductor layer may further include: removing the second mask layer.

Figure 7:
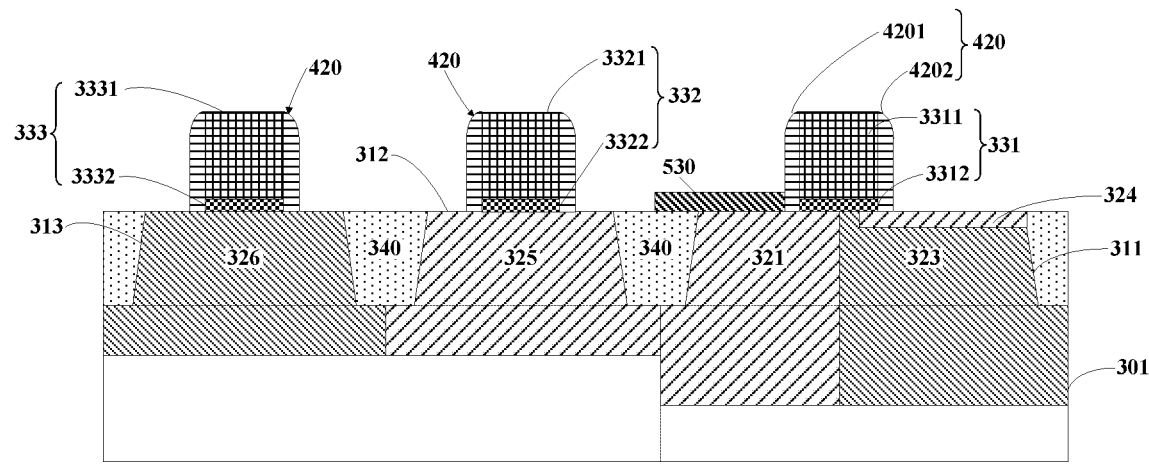

In some implementations, before the undoped semiconductor layer is formed and after the first doping is executed (described in the following), the manufacturing method may further include: as shown in FIG. 7, etching remained spacer layer so as to form a second part of the spacer 4202 covering the side surface of the first gate structure 331. The first part of the spacer 4201 and the second part of the spacer 4202 are located at two sides of the first gate structure 331, respectively; and may be collectively referred to as the spacer 420. In some implementations, as shown in FIG. 7, in the step of the etching remained spacer layer, the spacer 420 is also formed at side surfaces of the second gate structure 332 and the third gate structure 333.

Figure 8:
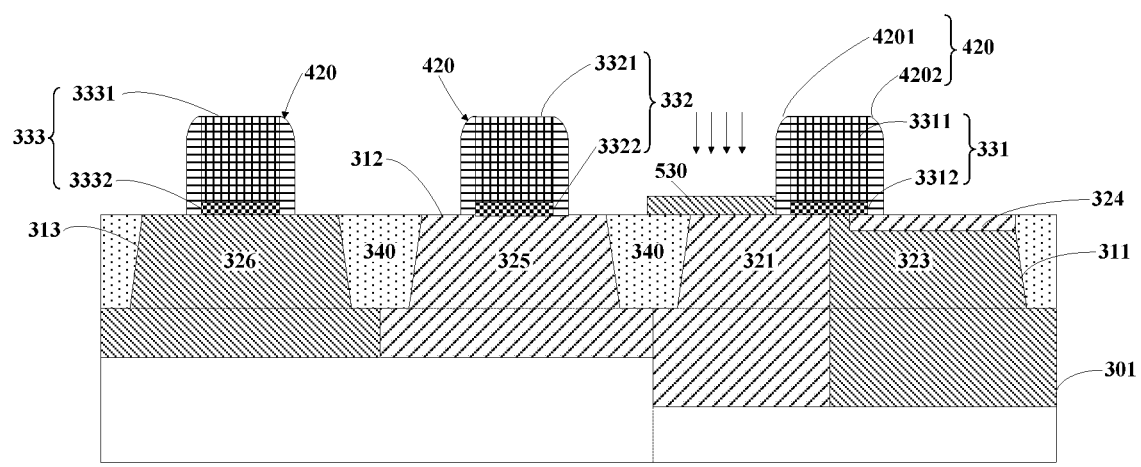

Subsequently, as shown in FIG. 8, a first doping is executed to the undoped semiconductor layer 530 so as to form the doped semiconductor layer. The first doping enables a conductivity type of the semiconductor layer 530 to be contrary to the conductivity type of the first doped region 321. The first doping may serve as a preparatory condition for subsequently forming a second doped region, and may also enable a contact and the semiconductor layer to form an ohmic contact when forming the contact on the semiconductor layer in the subsequent steps.

In some implementations, the first doping is executed by using an ion implantation.

In some implementations, the conductivity type of the first doped region 321 may be P-typed, and the first doping is executed by using an N-type ion implantation, so that the conductivity type of the semiconductor layer 530 is N-typed. For example, the N-type ion implantation may be executed using N-type dopants (such as phosphorus ions). A dose of the ion implantation may be $1\times10^4$ atom/cm2 to $1\times10^6$ atom/cm2 (for example, may be $1\times10^5$ atom/cm2).

In other implementations, the conductivity type of the first doped region 321 may be N-typed, and the first doping is executed by using a P-type ion implantation, so that the conductivity type of the semiconductor layer 530 is P-typed. For example, the P-type ion implantation may be executed by using P-type dopants (such as boron ions). A dose of the ion implantation may be $1\times10^4$ atom/cm2 to $1\times10^6$ atom/cm2 (for example, may be $1\times10^5$ atom/cm2).

In some implementations, energy of the ion implantation may be determined according to thickness of the semiconductor layer, so that a depth of the ion implantation does not exceed the semiconductor layer. That is, the ion implantation is not implanted into the first doped region 321. In this way, defects would not occur to the first active region because of the ion implantation. For example, the thickness of the semiconductor layer may be 500 A to 2000 A (for example, 1000 A to 1500 A).

In some implementations, the step of executing the first doping may include: forming a patterned third mask layer (not shown in the figure, such as photoresist) on a semiconductor structure shown in FIG. 7. The third mask layer exposes the semiconductor layer 530 and covers other parts of the semiconductor structure. Optionally, the step of executing the first doping may further include: for example, executing the foregoing first doping to the semiconductor layer 530 through the ion implantation process. Optionally, the step of executing the first doping may further include: removing the third mask layer.

In other implementations, the doped semiconductor layer may also be directly formed during the process of forming the semiconductor layer.

Figure 9:
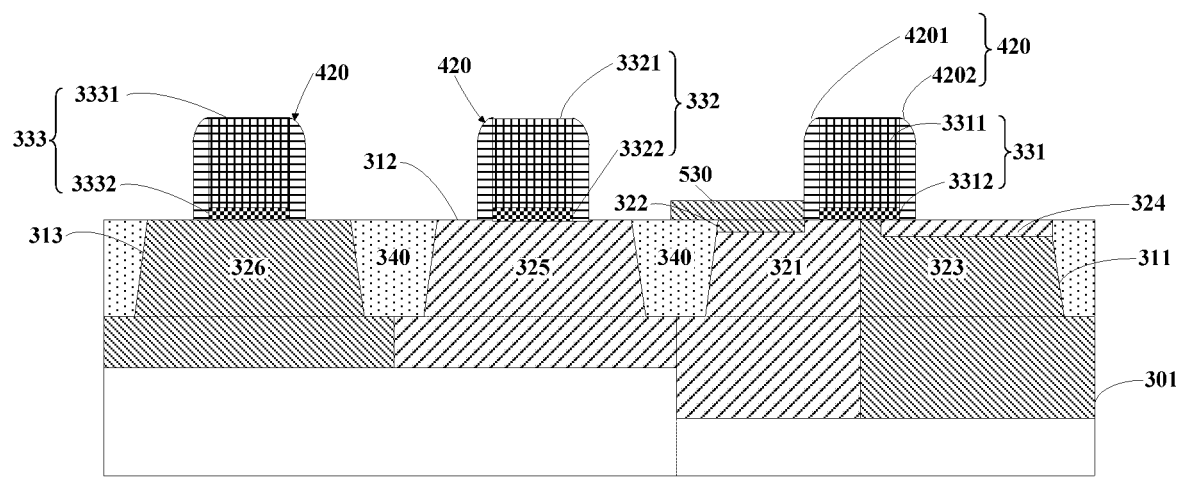

Subsequently, as shown in FIG. 9, annealing (may be referred to as the first annealing) is executed to diffuse dopants in the semiconductor layer 530 to a surface layer of the first doped region 321, so as to form a second doped region 322. The second doped region 322 is located at an upper surface of the first active region 311. For example, an upper surface of the second doped region 322 is a part of the upper surface of the first active region 311. A conductivity type of the second doped region 322 is contrary to the conductivity type of the first doped region 321. For example, the conductivity type of the first doped region may be P-typed, and the conductivity type of the second doped region may be N-typed. Further for example, the conductivity type of the first doped region may be N-typed, and the conductivity type of the second doped region may be P-typed. In some implementations, a temperature range of the annealing may be from 700° C. to 1000° C., and a time range of the annealing may be from 5 min to 1 h. For example, a temperature range of the annealing may be 750° C., and a time of the annealing may be 20 min.

The second doped region 322 herein is formed by annealing, and the second doped region 332 and the first doped region 321 may form a junction field. For example, an N/P junction may be formed for adjusting a capacitance of the FD region. In the process of annealing to propel dopants in the semiconductor layer 530 into the first doped region 321, depth and width of the propulsion are small (in the prior art, for example, an N/P junction is formed by directly performing an ion implantation at a Si surface, and depth and width of the formed N/P junction are great). Therefore, a shallow junction field is indirectly formed, and area and perimeter of the junction field are also small. Thus, damages to the Si surface caused by direct ion implantation are avoided, and the leakage current may be reduced.

Figure 10:
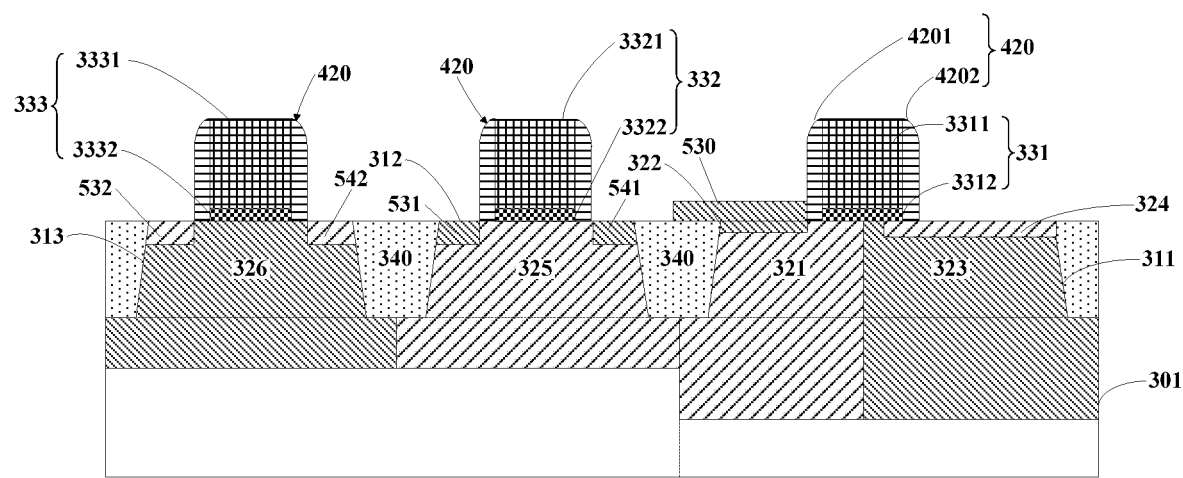

In some implementations, after the annealing, the manufacturing method may further include: as shown in FIG. 10, executing a second doping to the second active region 312, so as to form, in the fifth doped region 325, a first source electrode 531 and a first drain electrode 541 at two sides of the second gate structure 332, separately. For example, the second doping is executed through the ion implantation process. For example, the fifth doped region 325 may be P-typed, and the second doping is executed through an N-type ion implantation. Optionally, after the annealing, the manufacturing method may further include: executing a third doping to the third active region 313, so as to form, in the sixth doped region 326, a second source electrode 532 and a second drain electrode 542 at two sides of the third gate structure 333, separately. For example, the third doping is executed through the ion implantation process. For example, the sixth doped region 326 may be N-typed, and the third doping is executed through a P-type ion implantation. Certainly, a person skilled in the art should understand that an order of the foregoing second doping and the third doping is not limited. For example, the second doping may be first performed and then the third doping is performed; or the third doping may be first performed and then the second doping is performed. Therefore, the scope of the present invention is not only limited hereto.

Optionally, after the second doping and the third doping are performed, annealing (may be referred to as second annealing) may further be executed to the semiconductor structure. The annealing may be used to activate dopants in the source electrodes and the drain electrodes.

Figure 11:
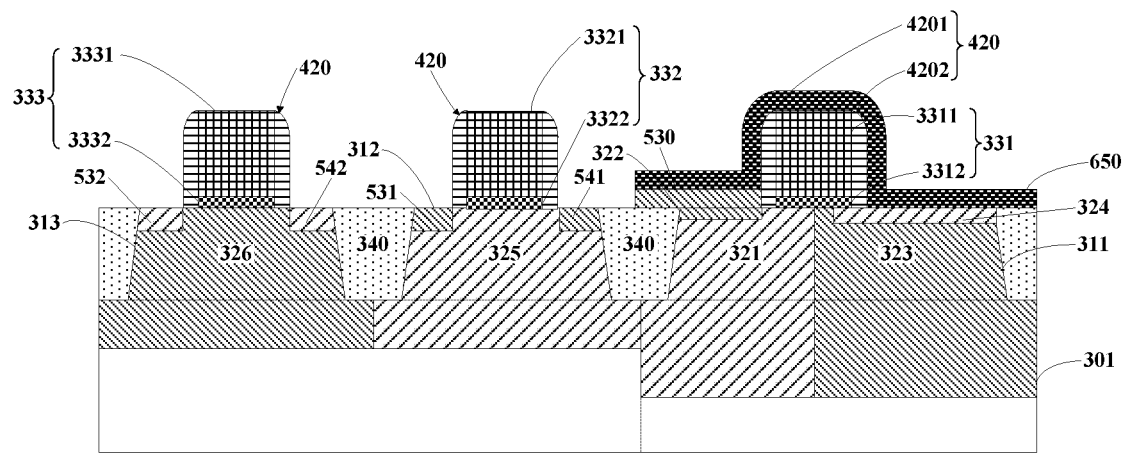

In some implementations, after the annealing (first annealing) is executed and before the contact (would be described in the following) is formed, the manufacturing method may further include: as shown in FIG. 11, forming a barrier layer 650 on a part of the first gate structure 331, the semiconductor layer 530, and the first active region 311. For example, the barrier layer 650 may be an SAB (salicide block region) and may be used to protect a device surface. The barrier layer 650 may further be formed on a portion of the spacer 420.

In some implementations, the foregoing second doping and the third doping are executed before the barrier layer 650 is formed.

Subsequently, the contact connected to the semiconductor layer is formed.

Figure 12:
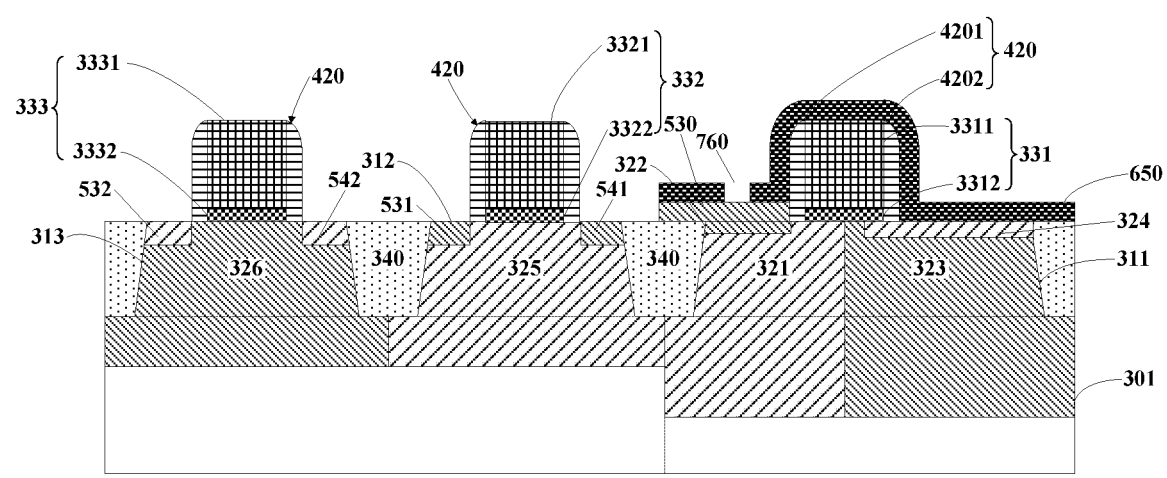
Figure 13:
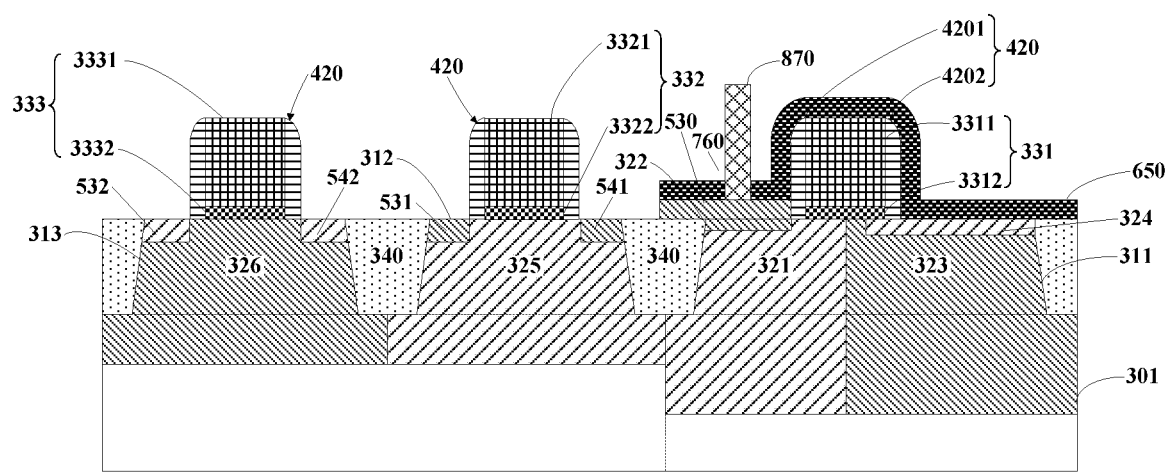

In some implementations, the process of the step of forming the contact may be described with reference to FIG. 12 and FIG. 13. Optionally, the step of forming the contact may include: as shown in FIG. 12, etching the barrier layer 650 to form an opening 760 exposing a part of the semiconductor layer 530. Optionally, the step of forming the contact may further include: as shown in FIG. 13, forming, in the opening 760, a contact 870 connected to the semiconductor layer 530. For example, material of the contact 870 may include metals such as: copper, aluminum, or tungsten.

Above, forms of a method for manufacturing an image sensor are provided.

Forms of the foregoing manufacturing method enable a contact to be formed on the semiconductor layer and not in direct contact with active regions. In this way, the active regions would not be directly damaged, damages to the active regions caused by etching the contact are reduced in when compared to the traditional process, and defects or damages caused when forming the contact are kept away from a junction field (such as a junction field formed by a second doped region and a first doped region). Therefore, leakage current may be reduced, and device performances may be improved.

Further, in the foregoing process of annealing (herein, referring to the first annealing) to propel dopants in the semiconductor layer into the first doped region, a depth and a width of the propulsion are small, and a shallow junction is formed. An area and a perimeter of the junction are also small. Therefore, the leakage current may also be reduced, and device performances may be improved.

In some implementations, after the contact is formed, a Back End Of Line (BEOL) may further be performed using the prior art.

The present disclosure further provides an image sensor. An image sensor according to forms of the present invention is described below in detail with reference to FIG. 13.

As shown in FIG. 13, the image sensor may include: a semiconductor substrate 301. For example, the semiconductor substrate 301 may be a silicon substrate or a substrate made of other materials.

As shown in FIG. 13, the image sensor may further include: a first active region 311 located on the semiconductor substrate 301. The first active region 311 may include: a first doped region 321 and a second doped region 322 abutting against the first doped region 321. In the present disclosure, the first doped region 321 abutting against the second doped region 322 indicates that the first doped region 321 and the second doped region 322 are at least in up-and-down contact along a vertical direction. In this implementation, the first doped region 321 and the second doped region 322 are also in left-and-right contact along a horizontal direction. The second doped region 322 is located at an upper surface of the first active region 311 (for example, an upper surface of the second doped region 322 is a part of the upper surface of the upper surface of the first active region 311), and the s second doped region 322 is formed by dopants in a semiconductor layer (would be described in the following) 530 that are annealed to be diffused to a surface layer of the first doped region 321.

In some implementations, a conductivity type of the first doped region 321 is contrary to a conductivity type of the second doped region 322. For example, the conductivity type of the first doped region 321 may be P-typed, and the conductivity type of the second doped region 322 may be N-typed. Further for example, the conductivity type of the first doped region 321 may be N-typed, and the conductivity type of the second doped region 322 may be P-typed. The second doped region 322 and the first doped region 321 form a junction field located in the first active region, where the junction field is a shallow junction.

As shown in FIG. 13, the image sensor may further include: a doped semiconductor layer 530 located on the first active region 311. For example, a conductivity type of the semiconductor layer 530 is same to the conductivity type of the second doped region 322. Material of the semiconductor layer 530, for example, may include polysilicon.

As shown in FIG. 13, the image sensor may further include: the contact 870 located on the semiconductor layer 530. For example, material of the contact 870 may include metals such as: copper, aluminum, or tungsten.

In some implementations, as shown in FIG. 13, the first active region 311 may further include: a third doped region 323 abutting against the first doped region 321. A conductivity type of the third doped region 323 is contrary to the conductivity type of the first doped region 321. For example, the conductivity type of the first doped region 321 may be P-typed, and the conductivity type of the third doped region 323 may be N-typed. Further for example, the conductivity type of the first doped region 321 may be N-typed, and the conductivity type of the third doped region 323 may be P-typed.

In some implementations, as shown in FIG. 13, the first doped region 321 and the third doped region 323 may extend into the semiconductor substrate 301, separately.

In some implementations, as shown in FIG. 13, the first active region 311 may further include: a fourth doped region 324 abutting against the third doped region 323 and separated from the first doped region 321. A part of the fourth doped region 324 is located below a first gate structure 331 (would be described in the following). A conductivity type of the fourth doped region 324 is contrary to the conductivity type of the third doped region 323. A PN junction of a photodiode is formed by the fourth doped region 324 and the third doped region 323.

In some implementations, as shown in FIG. 13, the image sensor may further include: a first gate structure 331 located on the first active region 311 and above a portion at which the first doped region 321 abuts against the third doped region 323. For example, the first gate structure 331 may include: a first gate insulator layer 3312 located on the first active region 311 and a first gate electrode 3311 on the first gate insulator layer 3312. Material of the first gate insulator layer 3312, for example, may include silicon dioxide. Material of the first gate electrode 3311, for example, may include polysilicon.

In some implementations, as shown in FIG. 13, the image sensor may further include: a spacer 420 located on the first active region 311 and at a side surface of the first gate structure 331. The spacer 420 may include a first part of the spacer 4201 and a second part of the spacer 4202 at two sides of the first gate structure 331. The spacer 420 (for example, the first part of the spacer 4201) separates the semiconductor layer 530 and the first gate structure 331.

In some implementations, as shown in FIG. 13, the image sensor may further include: a barrier layer 650 covering a part of the first gate structure 331, the semiconductor layer 530, and the first active region 311. The contact 870 passes through the barrier layer 650 so as to be in contact with the semiconductor layer 530. For example, the barrier layer 650 may be an SAB. The barrier layer may be used to protect a device surface.

In some implementations, as shown in FIG. 13, the image sensor may further include: a second active region 312 located on the semiconductor substrate 301 and separated from the first active region 311, and a third active region 313 located on the semiconductor substrate 301 and separated from the second active region 312. For example, a trench isolation portion 340 may be used to separate the second active region 312 and the first active region 311, and separate the third active region 313 and the second active region 312. As shown in FIG. 13, the second active region 312 may include a fifth doped region 325, and the third active region 313 may include a sixth doped region 326. The fifth doped region 325 and the sixth doped region 326 extend into the semiconductor substrate 301, separately. For example, a conductivity type of the sixth doped region 326 is contrary to a conductivity type of the fifth doped region 325.

In some implementations, as shown in FIG. 13, the image sensor may further include: a second gate structure 332 located on the second active region 312, and a third gate structure 333 located on the third active region 313.

For example, the second gate structure 332 may include: a second gate insulator layer 3322 located on the second active region 312 and a second gate electrode 3321 on the second gate insulator layer 3322. Material of the second gate insulator layer 3322, for example, may include silicon dioxide. Material of the second gate electrode 3321, for example, may include polysilicon.

For example, the third gate structure 333 may include: a third gate insulator layer 3332 located on the third active region 313 and a third gate electrode 3331 on the third gate insulator layer 3332. Material of the third gate insulator layer 3332, for example, may include silicon dioxide. Material of the third gate electrode 3331, for example, may include polysilicon.

In some implementations, as shown in FIG. 13, the image sensor may further include: a first source electrode 531 and a first drain electrode 541 in the second active region 312 and located at two sides of the second gate structure 332. The first source electrode 531 and the first drain electrode 541 abut against the fifth doped region 325, separately. That is, the first source electrode 531 and the first drain electrode 541 are in contact with the fifth doped region 325 in a horizontal direction, and are also in contact with the fifth doped region 325 in a vertical direction.

In some implementations, as shown in FIG. 13, the image sensor may further include: a second source electrode 532 and a second drain electrode 542 in the third active region 313 and located at two sides of the third gate structure 333. The second source electrode 532 and the second drain electrode 542 abut against the sixth doped region 326, separately. That is, the second source electrode 532 and the second drain electrode 542 are in contact with the sixth doped region 326 in a horizontal direction, and are also in contact with the sixth doped region 326 in a vertical direction.

In some implementations, as shown in FIG. 13, the spacer 420 may further be formed at side surfaces of the second gate structure 332 and the third gate structure 333.

In the image sensor of the present disclosure, a contact is formed on the semiconductor layer and is not in direct contact with active regions. In this way, the active regions would not be directly damaged, damages to the active regions caused by etching the contact are reduced in the traditional process, and defects or damages caused when forming the contact are kept away from a junction field (such as a junction field formed by a second doped region and a first doped region). Therefore, leakage current may be reduced, and device performances may be improved.

Further, the junction field formed by a second doped region and a first doped region is a shallow junction. A depth and a width of the shallow junction are small, and an area and a perimeter of the shallow junction are also small. Therefore, the leakage current may also be reduced, and device performances may be improved.

So far, the present disclosure is described in detail. To avoid covering the idea of the present invention, some details generally known in the art are not described. According to the foregoing description, a person skilled in the art may completely understand how to implement the technical solutions disclosed herein.

Some specific embodiments and forms of the present disclosure are described in detail through examples. However, a person skilled in the art should understand that the foregoing examples are merely for illustration, and are not intended to limit the scope of the present invention. A person skilled in the art should understand that the foregoing embodiments and forms may be modified without departing from the scope and spirit of the present invention. The scope of the present invention is defined by the appended claims.

What is claimed is:

1. A method for manufacturing an image sensor, comprising:
providing a semiconductor structure, wherein the semiconductor structure comprises: a semiconductor substrate and a first active region located on the semiconductor substrate, the first active region comprising a first doped region;
forming a doped semiconductor layer on the first active region;
annealing to diffuse dopants in the doped semiconductor layer to a surface layer of the first doped region, so as to form a second doped region, wherein the second doped region is located at an upper surface of the first active region; and
forming a contact connected to the doped semiconductor layer.

2. The method according to claim 1, wherein forming a doped semiconductor layer comprises:
forming an undoped semiconductor layer on the first doped region; and
executing a first doping to the undoped semiconductor layer so as to form the doped semiconductor layer, the first doping enabling a conductivity type of the doped semiconductor layer to be contrary to the conductivity type of the first doped region.

3. The method according to claim 1, wherein a conductivity type of the first doped region is contrary to a conductivity type of the second doped region.

4. The method according to claim 1, wherein material of the doped semiconductor layer comprises polysilicon.

5. The method according to claim 2, wherein the first doping is executed using an ion implantation, and energy of the ion implantation is determined according to thickness of the doped semiconductor layer, so that depth of the ion implantation does not exceed the doped semiconductor layer.

6. The method according to claim 2, further comprising:
before the doped semiconductor layer is formed, forming a first gate structure located on the first active region.

7. The method according to claim 6, further comprising:
before the doped semiconductor layer is formed, forming a spacer layer on the semiconductor structure and the first gate structure and partially etching the spacer layer to expose a part of the first doped region; and
wherein forming the doped semiconductor layer comprises: forming the doped semiconductor layer on the exposed part of the first doped region.

8. The method according to claim 7, wherein in the step of partially etching the spacer layer, the spacer layer covering a side surface of the first gate structure is etched to form a first part of the spacer;
wherein in the step of forming the doped semiconductor layer, the first part of the spacer separates the doped semiconductor layer and the first gate structure; and
wherein the method further comprises: after the undoped semiconductor layer is formed, and before the first doping is executed to the undoped semiconductor layer, etching a remaining spacer layer so as to form a second part of the spacer covering the side surface of the first gate structure.

9. The method according to claim 6, wherein the first active region further comprises:
a third doped region abutting against the first doped region,
wherein a conductivity type of the third doped region is contrary to a conductivity type of the first doped region, and the first gate structure is above a portion at which the first doped region abuts against the third doped region.

10. The method according to claim 9, wherein the first active region further comprises:
a fourth doped region abutting against the third doped region and separated from the first doped region, a part of the fourth doped region being located below the first gate structure,
wherein a conductivity type of the fourth doped region is contrary to the conductivity type of the third doped region.

11. The method according to claim 1, wherein
a temperature range of the annealing is from 700° C. to 1000° C., and
a time range of the annealing is from 5 min to 1 h.

12. The method according to claim 6, wherein the method further comprises: after the annealing is executed and before the contact is formed, forming a barrier layer on a part of the first gate structure, the doped semiconductor layer, and the first active region; and
wherein forming the contact comprises: etching the barrier layer to form an opening exposing a part of the doped semiconductor layer, and forming, in the opening, the contact connected to the doped semiconductor layer.

13. The method according to claim 1, wherein the method further comprises:
forming a second active region located on the semiconductor substrate and separated from the first active region, and forming a third active region located on the semiconductor substrate and separated from the second active region,
wherein the second active region comprises a fifth doped region, the third active region comprises a sixth doped region, and a conductivity type of the sixth doped region is contrary to a conductivity type of the fifth doped region.

14. The method according to claim 13, wherein the method further comprises:
forming a second gate structure located on the second active region, and a third gate structure located on the third active region; and
after the annealing and before the contact is formed:
executing a second doping to the second active region, so as to form, in the fifth doped region, a first source electrode and a first drain electrode at two sides of the second gate structure, separately; and
executing a third doping to the third active region, so as to form, in the sixth doped region, a second source electrode and a second drain electrode at two sides of the third gate structure, separately.

* * * * *